(12) United States Patent
Sashida

(10) Patent No.: US 7,153,735 B2
(45) Date of Patent: Dec. 26, 2006

(54) METHOD OF MANUFACTURING SEMICONDUCTOR DEVICE

(75) Inventor: Naoya Sashida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 13 days.

(21) Appl. No.: 11/048,752

(22) Filed: Feb. 3, 2005

(65) Prior Publication Data

US 2005/0148139 A1    Jul. 7, 2005

Related U.S. Application Data

(63) Continuation of application No. PCT/JP02/13485, filed on Dec. 25, 2002.

(51) Int. Cl.
    *H01L 21/8242* (2006.01)
(52) U.S. Cl. .................. 438/239; 438/240; 438/624; 438/622; 438/644; 257/E21.162; 257/E21.576
(58) Field of Classification Search .................. None
    See application file for complete search history.

(56) References Cited

U.S. PATENT DOCUMENTS

| 6,368,909 B1 | 4/2002 | Koo |
| 6,570,223 B1 * | 5/2003 | Machida et al. ............ 257/347 |

FOREIGN PATENT DOCUMENTS

| CN | 1337063 | 2/2002 |
| EP | 1 061 573 A2 | 12/2000 |
| JP | 61-26227 | 2/1986 |
| JP | 63-248137 | 10/1988 |
| JP | 6-188249 | 7/1994 |
| JP | 11-330390 | 11/1999 |
| JP | 11-354727 | 12/1999 |
| JP | 2001-36025 | 2/2001 |
| JP | 2001-60669 | 3/2001 |
| JP | 2002-270788 | 9/2002 |
| JP | 2002-289793 | 10/2002 |
| WO | WO01/39258 | * 5/2001 |

OTHER PUBLICATIONS

Wolf et al. Silicon Processing for the VLSI Era, vol. 1- Process Technology, Lattice Press 1986, pp. 191-194.*
Chinese Office Action dated Aug. 25, 2006, issued in corresponding Chinese Patent Application No. 028294734.

* cited by examiner

*Primary Examiner*—Michael Lebentritt
*Assistant Examiner*—Kyoung Lee
(74) *Attorney, Agent, or Firm*—Westerman, Hattori, Daniels & Adrian, LLP.

(57) ABSTRACT

A method of manufacturing a semiconductor device comprises the steps of forming a first insulating film 9, 10 above a semiconductor substrate 1; forming a capacitor Q having a lower electrode 11a, a dielectric film 13a, and an upper electrode 14c on the first insulating film 9, 10; forming a second insulating film 15, 15a, 16 coating the capacitor Q; and forming a stress-controlling insulating film 30 on the rear surface of the semiconductor substrate 1 after the second insulating film 15, 15a, 16 have been formed.

19 Claims, 13 Drawing Sheets

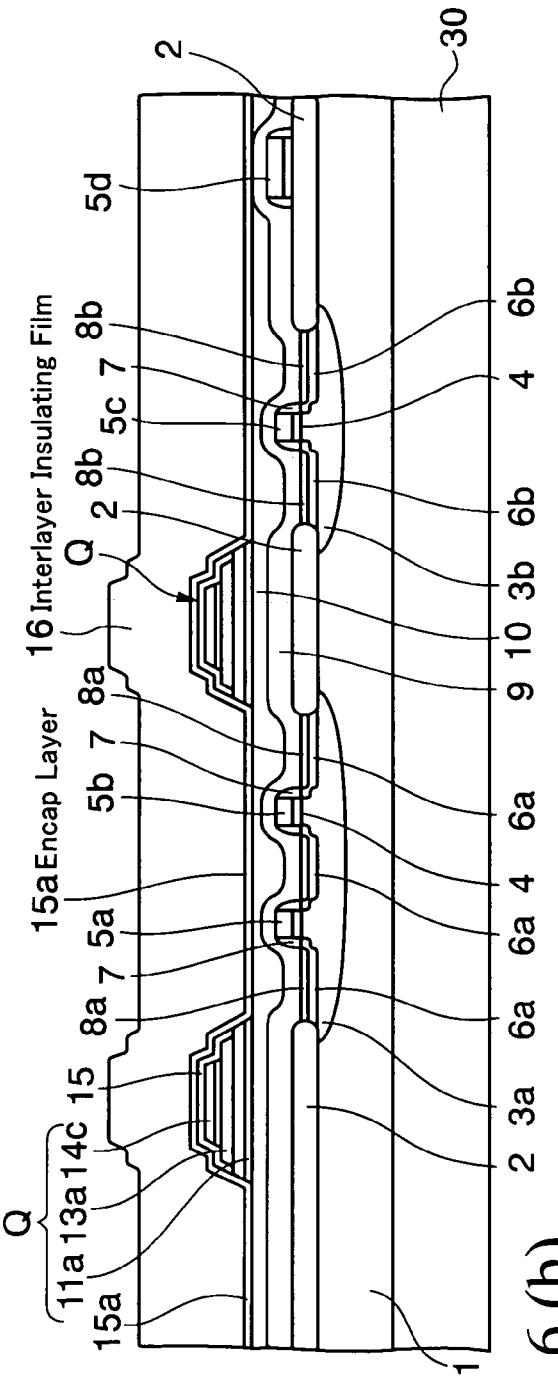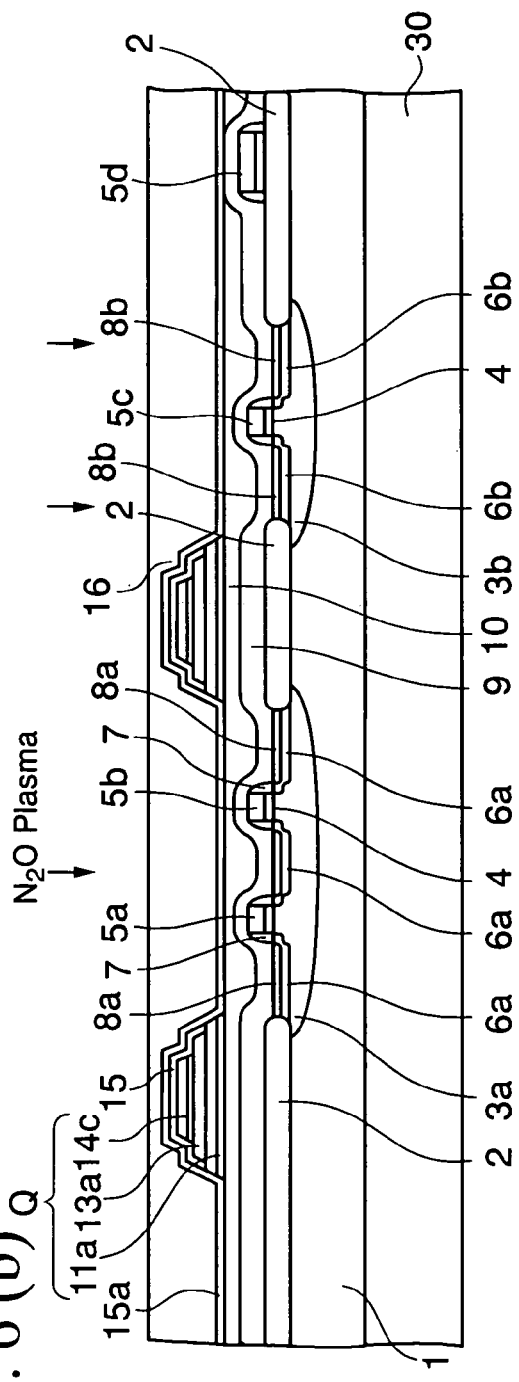
FIG. 6 (a)
FIG. 6 (b)

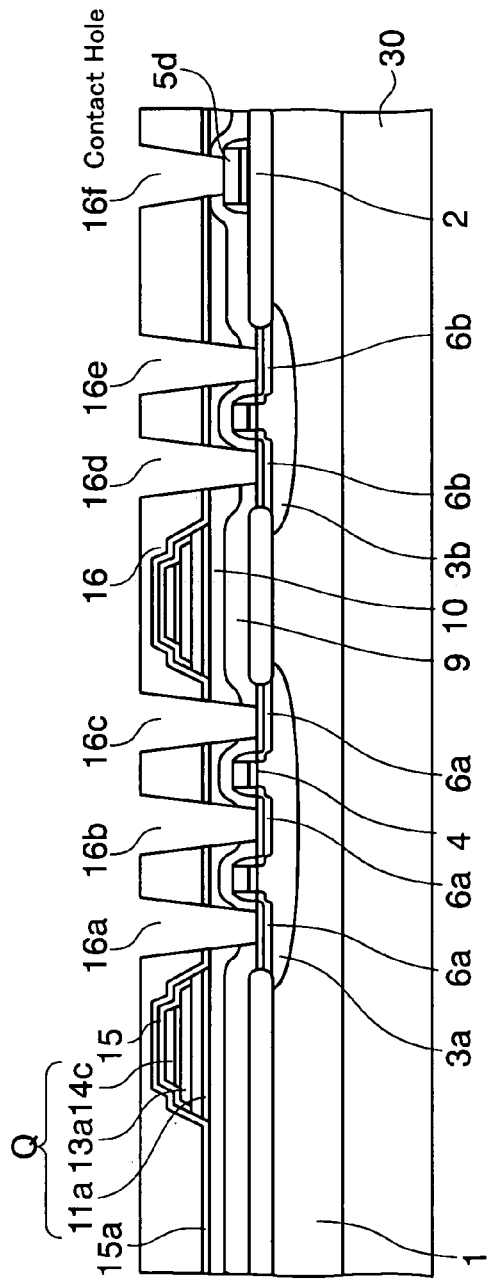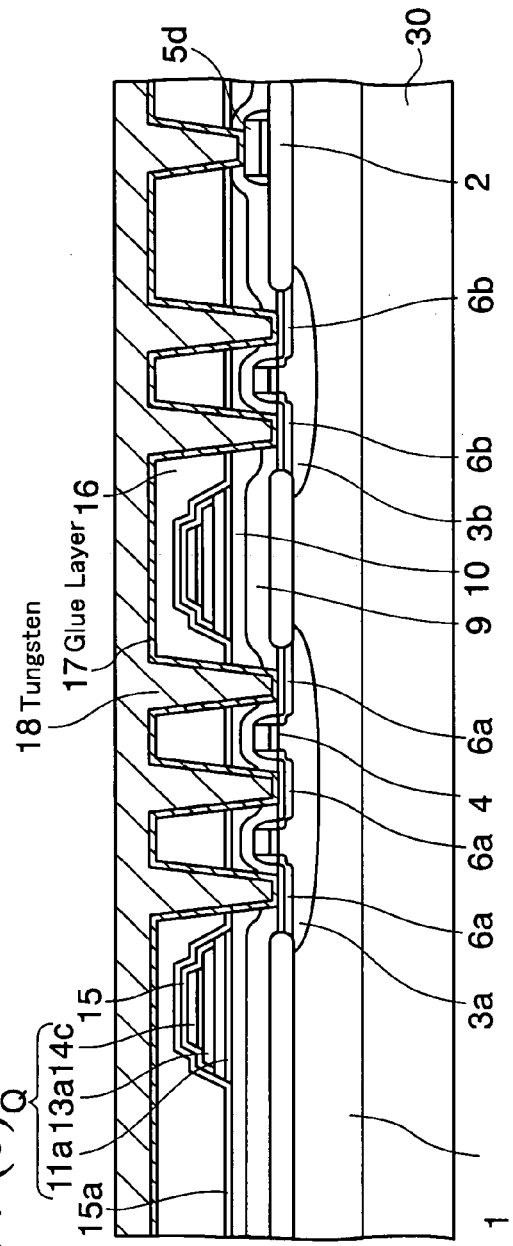
FIG. 7 (a)
FIG. 7 (b)

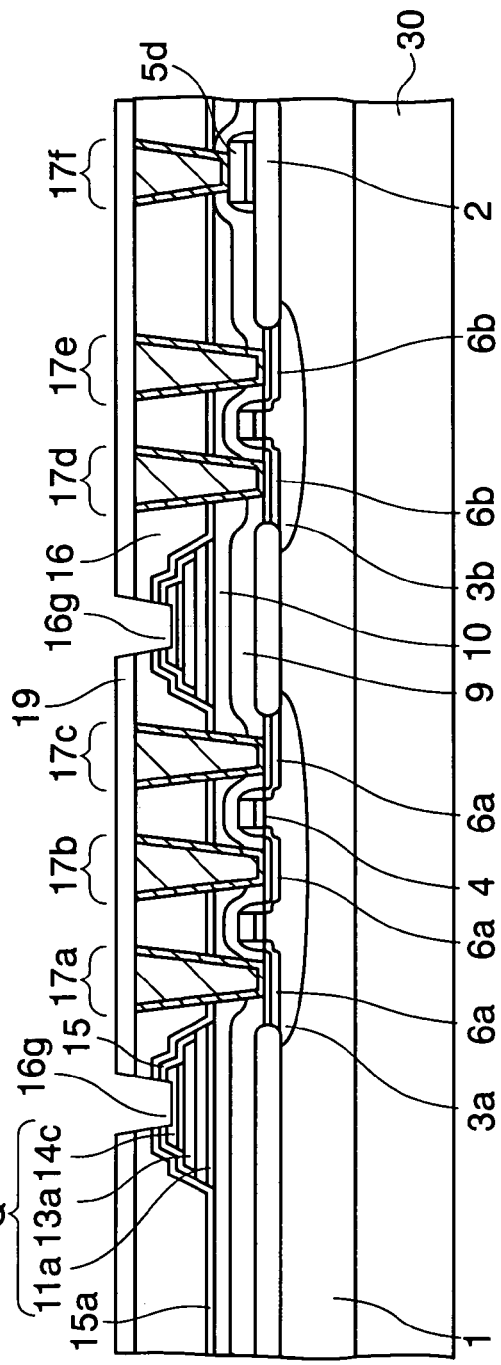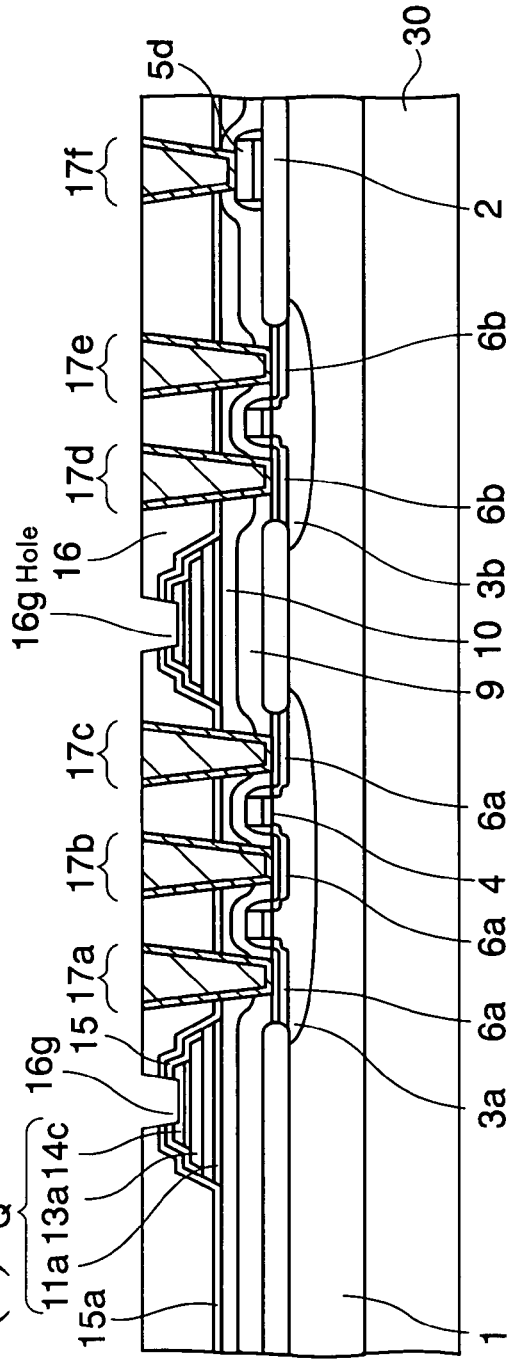

METHOD OF MANUFACTURING SEMICONDUCTOR DEVICE

CROSS-REFERENCE TO RELATED APPLICATIONS

This application is a continuation of prior International Patent Application No. PCT/JP2002/013485, filed Dec. 25, 2002, the entire content of which are incorporated herein by reference.

TECHNICAL FIELD

The present invention relates to a method of manufacturing a semiconductor device, more particularly to a method of manufacturing a semiconductor device having capacitors.

BACKGROUND ART

There is known a flash memory and an FeRAM (Ferroelectric Random Access Memory) as a non-volatile memory capable of storing information even if a power source is turned off.

The flash memory has a floating gate buried in a gate insulating film of an insulated-gate field effect transistor (IGFET), and stores information by accumulating charges that become storage information in the floating gate. Tunnel current passing through a gate insulating film needs to be flown in order to write and erase information, and thus relatively high voltage is required.

The FeRAM has ferroelectric capacitors that store information by utilizing hysteresis characteristics of ferroelectric. A ferroelectric film formed between an upper electrode and a lower electrode in the ferroelectric capacitors generates polarization according to voltage applied between the upper electrode and the lower electrode, and the polarity of spontaneous polarization is inverted when the polarity of applied voltage is inverted. It is possible to read out information when the polarity and the strength of the spontaneous polarization are detected.

The FeRAM has an advantage that it operates by lower voltage and is capable of high-speed writing at saved power comparing to the flash memory.

The memory cell of the FeRAM, as described in Document 1 (Japanese Patent Laid-open 2001-60669 publication), for example, has a MOS transistor formed on an silicon substrate, a first interlayer insulating film formed on the silicon substrate and the MOS transistor, ferroelectric capacitors formed on the first interlayer insulating film, a second interlayer insulating film formed on the ferroelectric capacitors and the first interlayer insulating film, conductive plugs that are buried in holes formed in the first and second interlayer insulating films and connected to the MOS transistor, a first wiring pattern that connects the conductive plug with the upper electrode of the ferroelectric capacitor, a third interlayer insulating film formed on the first wiring pattern and the second interlayer insulating film, and a second wiring pattern formed on the third interlayer insulating film.

Meanwhile, when the first wiring pattern is formed of aluminum, the remanent polarization characteristic of the ferroelectric capacitor deteriorates due to the tensile stress of the first wiring pattern. To improve this, Document 2 (Japanese Patent Laid-open 2001-36025 publication) describes that an aluminum film is heated at temperature exceeding Curie point (Curie Temperature) of the ferroelectric film that constitutes the ferroelectric capacitor to loosen the tensile strength, and then the aluminum film is patterned to form a wiring pattern.

Further, Document 3 (Japanese Patent Laid-open 11-330390 publication) describes that an interlayer insulating film is formed so as to have tensile stress to the ferroelectric capacitor.

Furthermore, Document 4 (Japanese Patent Laid-open 6-188249 publication) describes a method of suppressing warp of a substrate by forming an SiN film, which has composition and a film thickness same as the composition and the film thickness of an SiN film formed on a substrate surface before forming the capacitors, on the rear surface of the substrate.

According to Document 1, the interlayer insulating film covering the ferroelectric capacitors has strong compressive stress where force in a self-expanding direction works. Therefore, when a plurality of interlayer insulating films are formed on the ferroelectric capacitors in a laminated manner, contractive force is applied to the ferroelectric capacitors every film forming step, and thus it deteriorates the ferroelectric capacitors.

Further, according to Document 2, since the interlayer insulating film still exists in spaces between the first wiring patterns, there is still a problem that the compressive stress of the interlayer insulating film deteriorates the ferroelectric capacitors regardless of the stress of the first wiring pattern.

Furthermore, according to Document 3, the interlayer insulating film having tensile stress has high moisture content, and thus it results in another problem such that the moisture deteriorates the ferroelectric capacitors.

Still further, in the method of Document 4, survey by the inventors of the present invention made it clear that stress applied to the capacitors significantly varied in a wafer and uniform stress adjustment was difficult.

DISCLOSURE OF THE INVENTION

It is an object of the present invention to provide a method of manufacturing a semiconductor device where the characteristics of capacitors covered by an interlayer insulating film can be maintained excellently and uniformly, or can be improved.

The above-described problem is solved by a method of manufacturing a semiconductor device, which has the steps of forming a first insulating film above a semiconductor substrate, forming a capacitor, which have a lower electrode, a dielectric film, and an upper electrode, on the first insulating film, forming a second insulating film coating the capacitor, and forming a stress-controlling insulating film on the rear surface of the semiconductor substrate after formation of the second insulating film.

According to the present invention, the stress-controlling insulating film is deposited on the rear surface of the substrate after formation of the second insulating film coating the capacitor. For example, the stress-controlling insulating film is formed so as to have the same compressive stress or the same tensile stress as the second insulating film. Thus, the stress generated by the second insulating film is loosened and uniform stress adjustment can be performed. As a result, the characteristics of the capacitors can be maintained excellently and uniformly or the characteristics can be improved. According to an experiment by the inventors of the present invention, the characteristics and their variation could be improved when the present invention was applied to the method of manufacturing an FeRAM provided with a capacitor insulating film of ferroelectric.

Further, since the stress can be reduced on the entire wafer, so-called edge deterioration that occurs remarkably on the FeRAM of a planar structure can be prevented. The edge deterioration is a phenomenon that stress concentrates on the side portion of the dielectric film of the capacitors, which is at an edge portion of a lower electrode common to the plurality of capacitors, and thus the capacitor characteristics are inclined to deteriorate. The phenomenon could occur when an insulating film, which is formed by using TEOS as a material, is formed on the capacitors.

Furthermore, the same compressive stress can be given particularly to the second insulating film and the stress-controlling insulating film in the present invention. In this case, the capacitors can be coated by an insulating film of good quality having small moisture content, which is preferable.

Additionally, the stress-controlling insulating film formed on the rear surface of the semiconductor device can be removed if it is not necessary. In this case, the stress-controlling insulating film should be removed after the process of forming wiring, which connects with the upper electrode of the capacitors via a hole penetrating the second insulating film, on the second insulating film. This is due to the following reasons. Though a process of annealing at high temperature is performed through the hole, which has been formed by etching in the second insulating film above the upper electrode of the capacitors, in order to improve the film quality of the dielectric film of the capacitors, then there is no thermal treatment process at higher temperature after the annealing is completed. And even if the stress-controlling insulating film is removed, an amount of change in stress that has been adjusted is small after the wiring is formed on the second insulating film.

BRIEF DESCRIPTION OF DRAWINGS

FIGS. 6(a) and (b) are sectional views (6) showing the manufacturing process of a semiconductor device according to the embodiment of the present invention.

FIGS. 7(a) and (b) are sectional views (7) showing the manufacturing process of a semiconductor device according to the embodiment of the present invention.

FIGS. 9(a) and (b) are sectional views (9) showing the manufacturing process of a semiconductor device according to the embodiment of the present invention.

BEST MODE FOR CARRYING OUT THE INVENTION

The embodiments of the present invention will be explained as follows based on the drawings.

FIGS. 1 to 11 are the sectional views showing the manufacturing process of the FeRAM of a planar structure according to the embodiments of the present invention.

Description will be made for the process until the structure shown in FIG. 1 will be formed.

Figure 1:
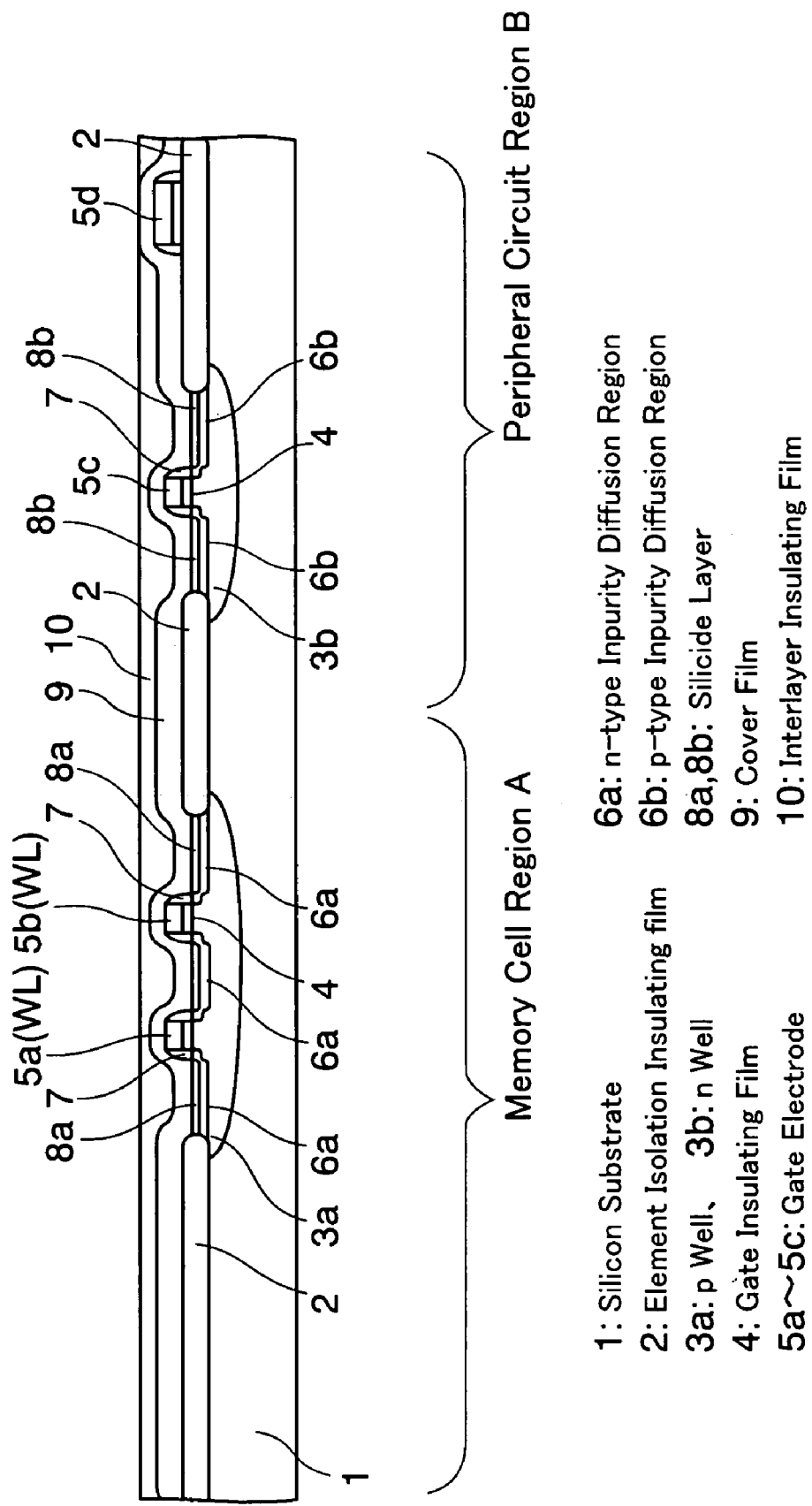
FIG. 1 is a sectional view (1) showing a manufacturing process of a semiconductor device according to an embodiment of the present invention.
Figure 2:
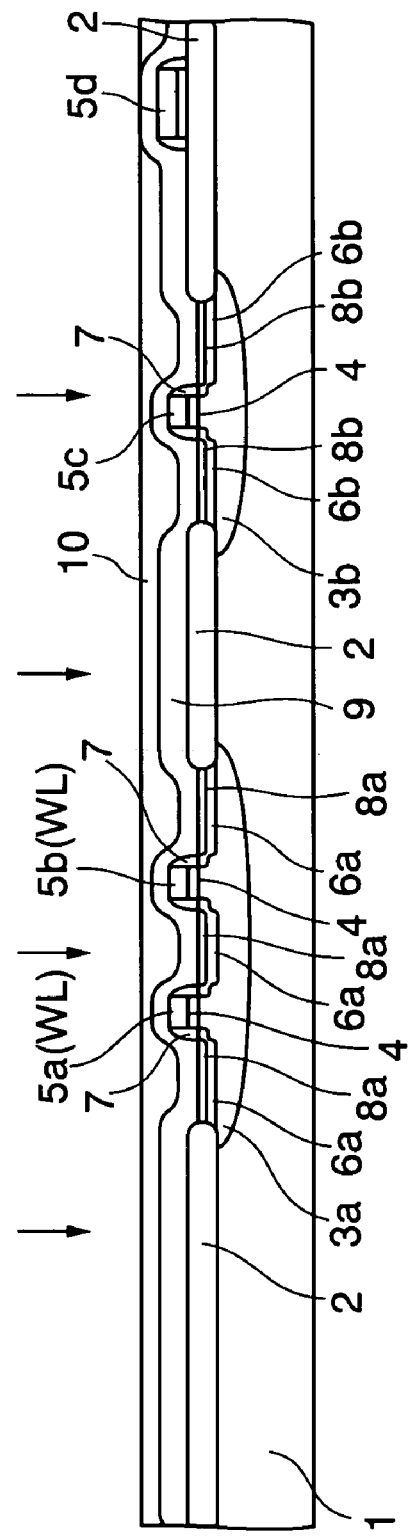
FIGS. 2(a) and (b) are sectional views (2) showing the manufacturing process of a semiconductor device according to the embodiment of the present invention.
Figure 2:
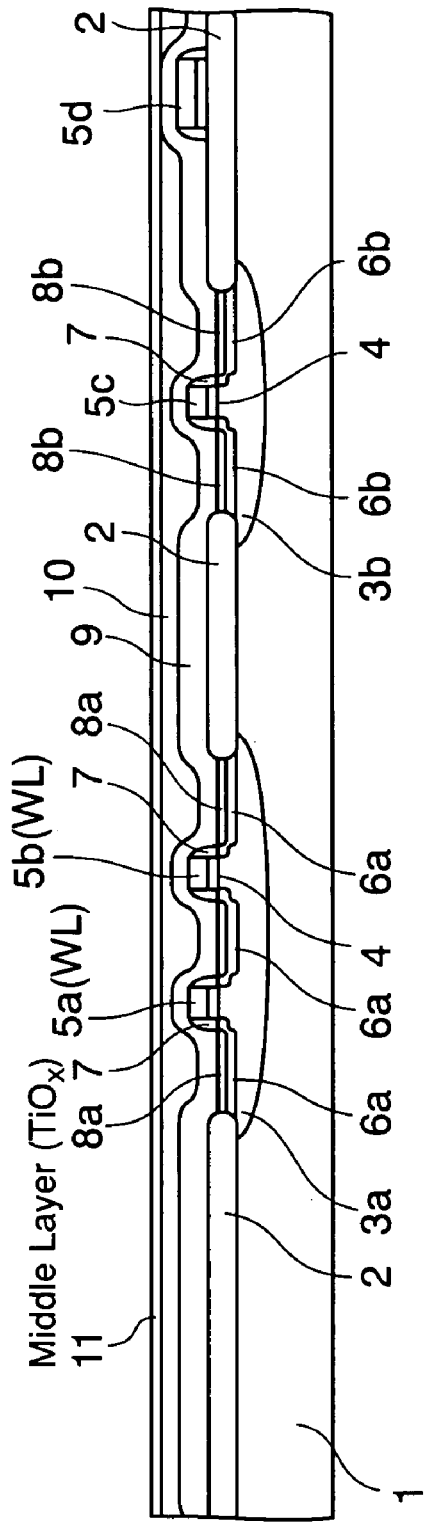
Figure 3:
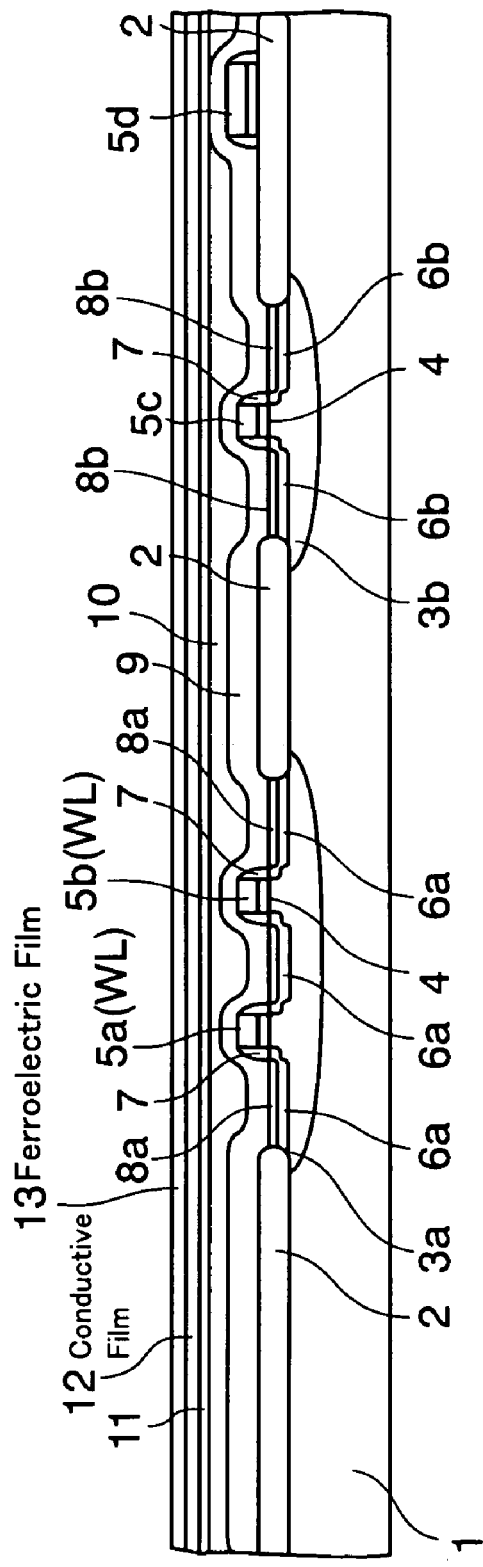
FIGS. 3(a) and (b) are sectional views (3) showing the manufacturing process of a semiconductor device according to the embodiment of the present invention.
Figure 3:
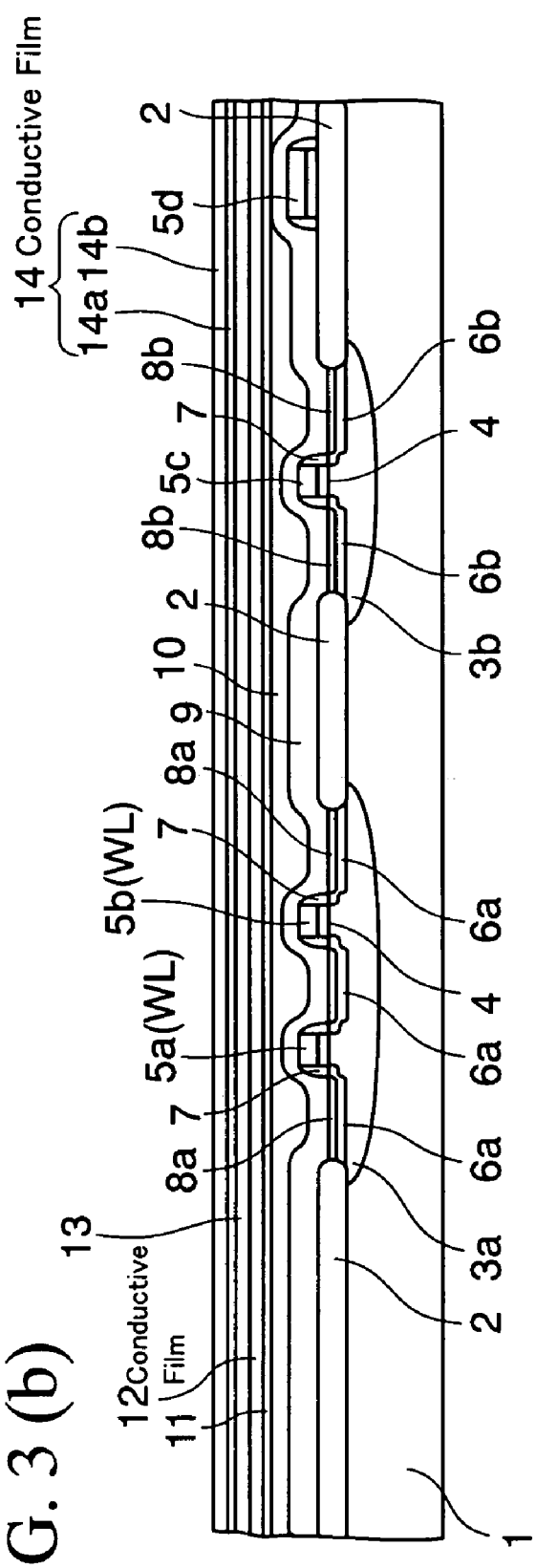
Figure 4:
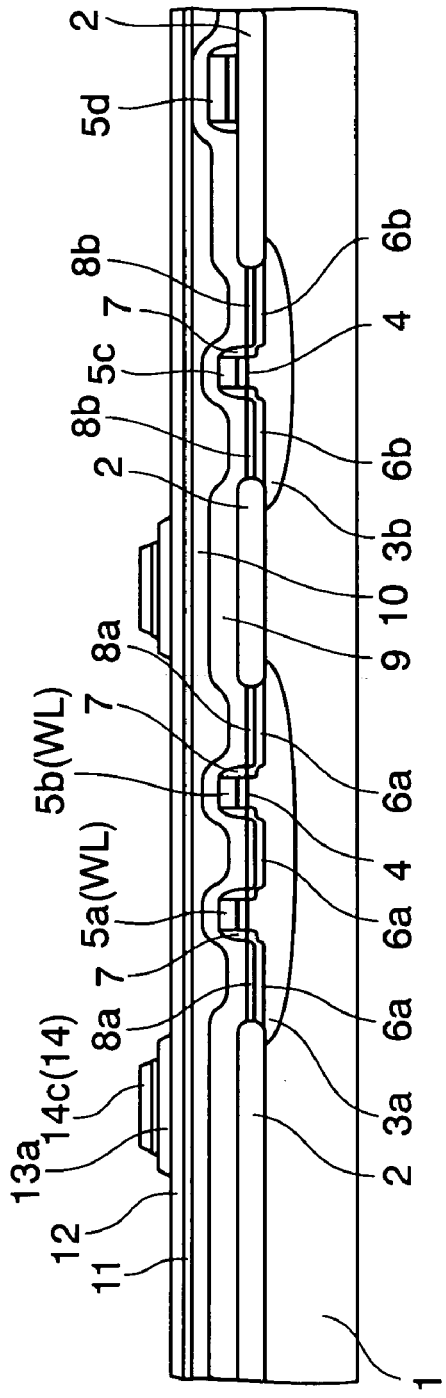
FIGS. 4(a) and (b) are sectional views (4) showing the manufacturing process of a semiconductor device according to the embodiment of the present invention.
Figure 4:
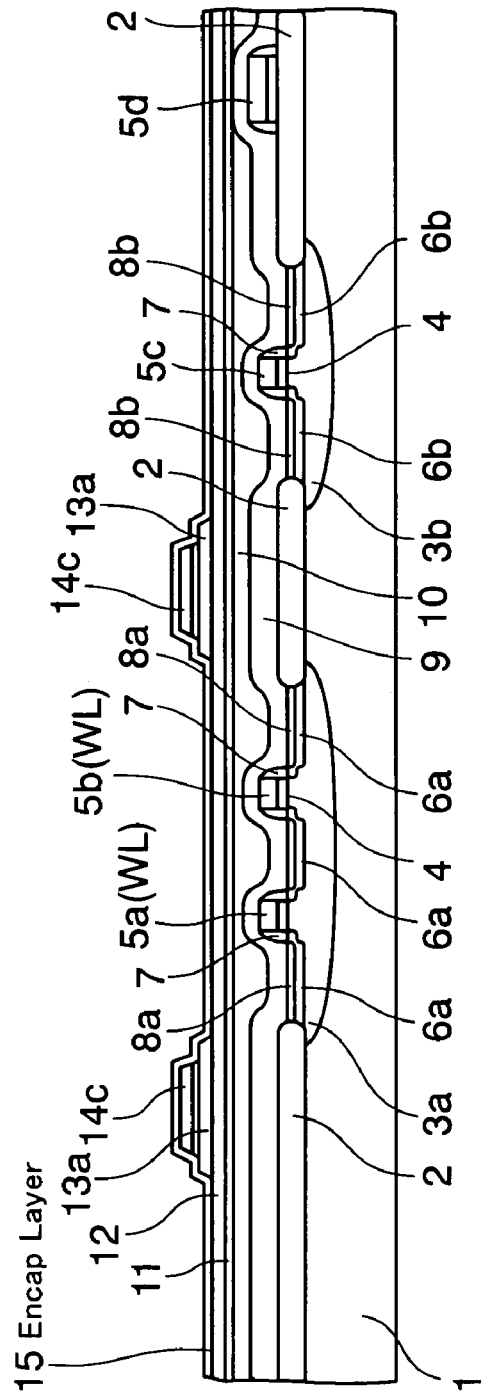
Figure 5:
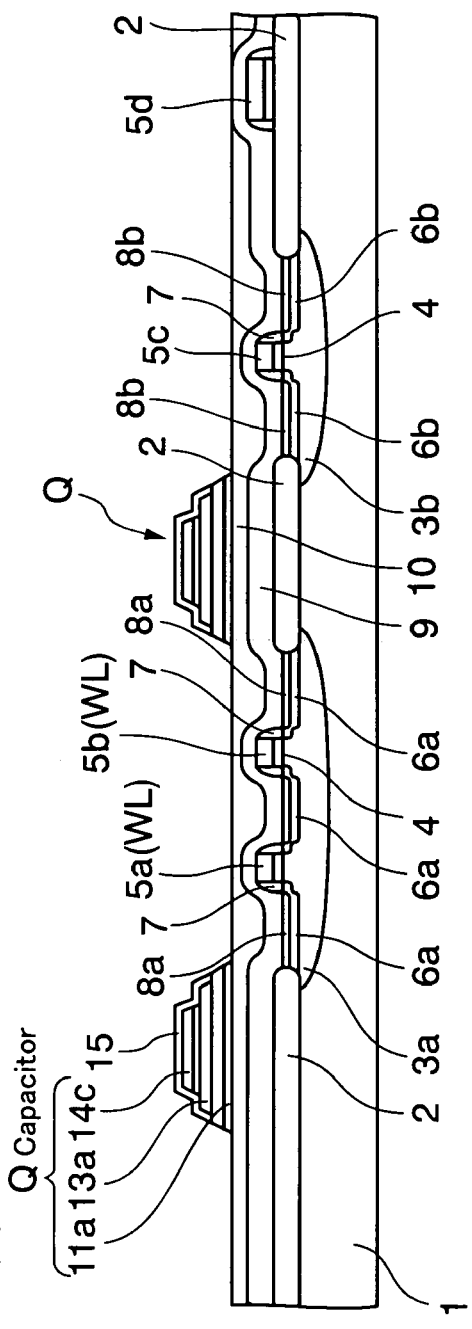
FIGS. 5(a) and (b) are sectional views (5) showing the manufacturing process of a semiconductor device according to the embodiment of the present invention.
Figure 5:
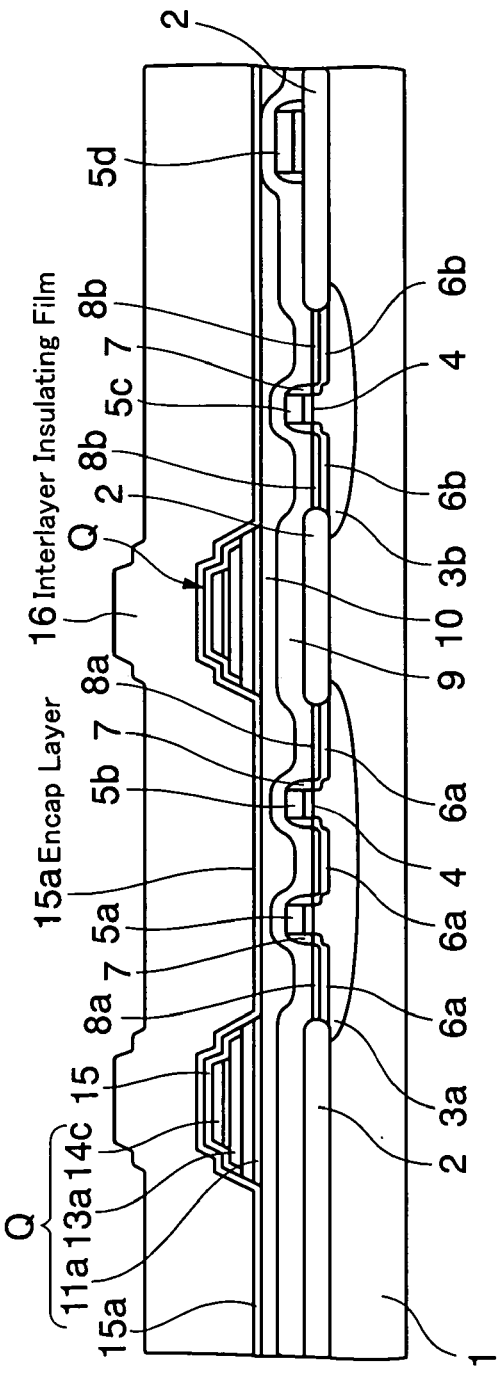
Figure 8:
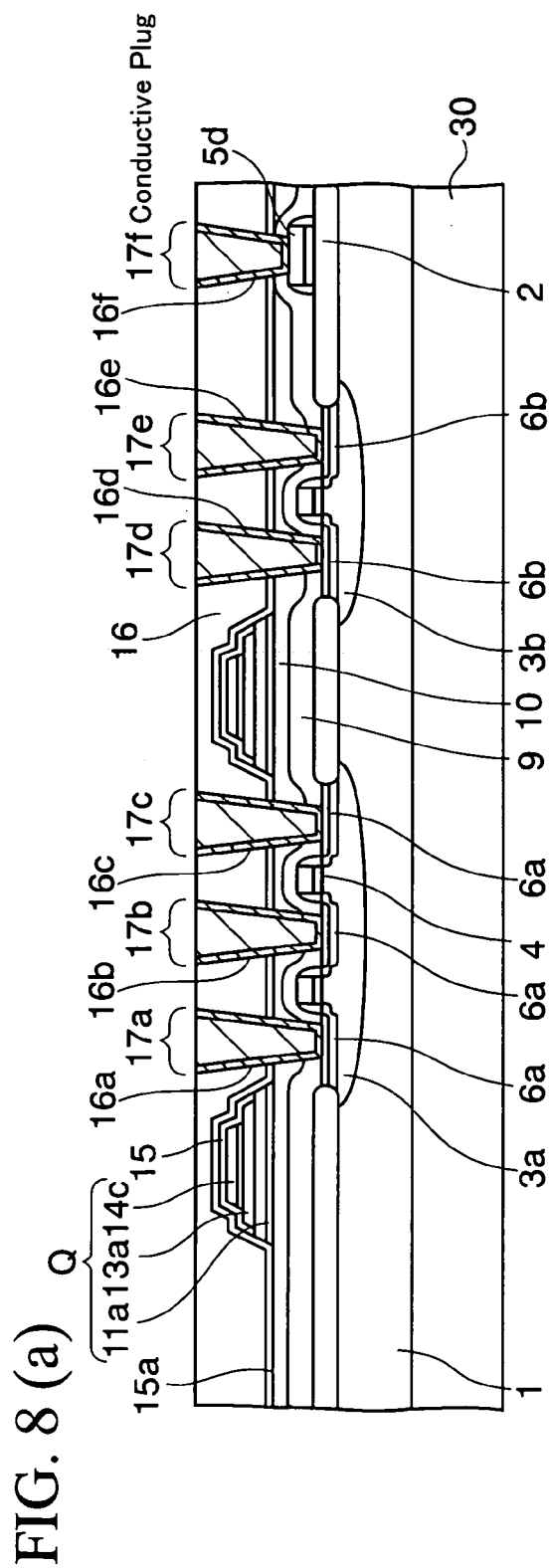
FIGS. 8(a) and (b) are sectional views (8) showing the manufacturing process of a semiconductor device according to the embodiment of the present invention.
Figure 8:
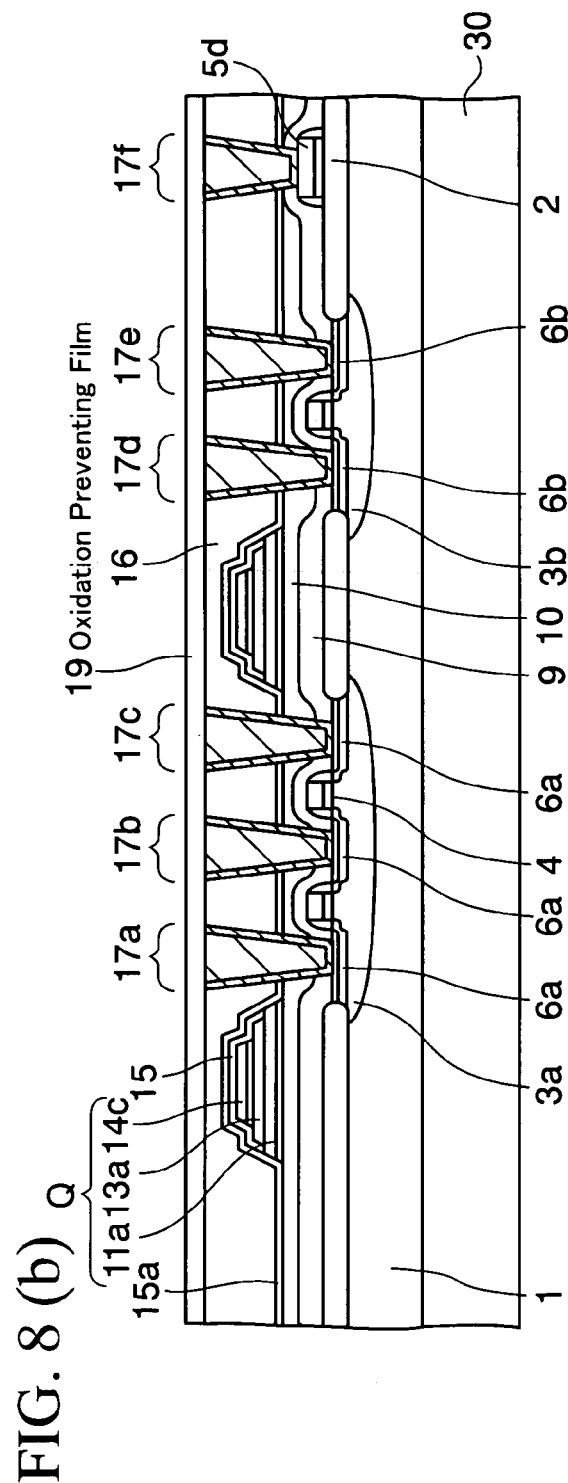

First, as shown in FIG. 1, an element isolation insulating film 2 is formed on the surface of an n-type or a p-type silicon (semiconductor) substrate 1 by a LOCOS (Local Oxidation of Silicon) method. An STI (Shallow Trench Isolation) structure may be employed other than the structure formed by the LOCOS method.

After such element isolation insulating film 2 is formed, a p-type impurity and an n-type impurity are selectively introduced in predetermined active regions (transistor forming regions) of a memory cell region A and a peripheral circuit region B of the silicon substrate 1 to form a p-well 3a and an n-well 3b. Note that not only the n-well 3b but also a p-well (not shown) is formed in order to form CMOS in the peripheral circuit region B.

Then, the active region surface of the silicon substrate 1 is thermally oxidized to form a silicon oxide film that serves as a gate insulating film 4.

Next, an amorphous or a polycrystalline silicon film is formed on the entire upper surface of the silicon substrate 1, and subsequently, resistance of the silicon film is reduced by ion implantation of impurity. After that, the silicon film is patterned into a predetermined shape by photolithography to form gate electrodes 5a, 5b, 5c and wiring 5d.

In the memory cell region A, the two gate electrodes 5a, 5b are arranged substantially in parallel with each other and upon being spaced apart on one p-well 3a, and they extend in a perpendicular direction with respect to a paper surface of the drawing. The gate electrodes 5a, 5b form a part of word lines WL.

Next, an n-type impurity is ion-implanted into the p-well 3a on both sides of the gate electrodes 5a, 5b to form three n-type ion impurity diffusion regions 6a that serve as source/drain of an n-channel MOS transistor. At the same time, an n-type impurity diffusion region is also formed in the p-well (not shown) of the peripheral circuit region B.

Subsequently, in the peripheral circuit region B, a p-type impurity is ion-implanted to both sides of the gate electrode 5c of the n-well 3b to form a p-type impurity diffusion region 6b that serves as source/drain of a p-channel MOS transistor.

Then, after an insulating film is formed on the entire surface of the silicon substrate 1, the insulating film is etched back to leave it as a sidewall insulating film 7 only on both side portions of the gate electrodes 5a to 5c. As the insulating film, silicon oxide ($SiO_2$) is formed by a CVD (Chemical Vapor Deposition) method, for example.

Further, by implanting the n-type impurity ion again into the p-well 3a while the gate electrodes 5a to 5c and the sidewall insulating film 7 are used as a mask, the n-type impurity diffusion region 6a is transformed into an LDD structure, and the p-type impurity diffusion region 6b is also transformed into the LDD structure by implanting the p-type impurity ion again into the n-well 3b.

Note that implantation of the n-type impurity and the p-type impurity is controllably performed using resist patterns.

As described above, the p-well 3a, the gate electrodes 5a, 5b, the n-type impurity diffusion region 6a on the both sides thereof, and the like constitute an n-type MOSFET in the memory cell region A, and the n-well 3b, the gate electrode 5c, the p-type impurity diffusion region 6b on the both sides thereof, and the like constitute an p-type MOSFET in the peripheral circuit region B.

Next, after a refractory metal film such as a film of Ti or Co, for example, has been formed on the entire surface, the refractory metal film is heated to form refractory metal silicide layers 8a, 8b on the surface of the n-type impurity diffusion region 6a and the p-type impurity diffusion region 6b, respectively. Then, the refractory metal film that has not been reacted is removed by wet etching.

Next, a silicon oxynitride (SiON) film as a cover film 9 is formed by the thickness of about 200 nm on the entire surface of the silicon substrate 1 by a plasma enhanced CVD method. In addition, silicon dioxide ($SiO_2$) as a first interlayer insulating film 10 is formed by the thickness of about 1.0 μm on the cover film 9 by the plasma enhanced CVD method using TEOS gas. Note that an insulating film that is formed by the plasma enhanced CVD method using TEOS gas will be also referred to as a PE-TEOS film hereinafter.

Subsequently, the top surface of the first interlayer insulating film 10 is polished by a chemical mechanical polishing method to be planarized.

Next, description will be made for the process until the structure shown in FIG. 2(a) will be formed.

Firstly, the planarized surface of the first interlayer insulating film 10 is reformed by plasma of ammonia ($NH_3$) gas. Note that treatment where the surface of an insulating film is reformed by plasma of $NH_3$ gas is also referred to as $NH_3$ plasma treatment hereinafter.

As the $NH_3$ plasma treatment conditions in this process, settings are made as follows. 350 sccm is set as $NH_3$ gas flow rate to be introduced into a chamber, 1 Torr as pressure inside the chamber, 400° C. as a substrate temperature, 100 W as power of a high-frequency power source, 55 W as power of a high-frequency power source of 350 kHz to be supplied into a plasma generating region, 350 mils as a distance between an electrode and the first interlayer insulating film, and 60 seconds as a plasma irradiation time, respectively.

After that, as shown in FIG. 2(b), a middle layer (self-orientation layer) 11 made of a material having self-orientation property is formed on the first interlayer insulating film 10. The middle layer 11 is formed by the following process, for example.

Firstly, a titanium (Ti) film having the thickness of 20 nm is formed on the first interlayer insulating film 10 by a DC sputtering method, the Ti film is subsequently oxidized by RTA (Rapid Thermal Annealing) to form a titanium oxide ($TiO_x$) film which is used as the middle layer 11.

In the oxidization conditions of the Ti film, 700° C. is set as substrate temperature, 60 seconds as oxidation time, and 1% and 99% as oxygen ($O_2$) and argon (Ar) in oxidizing atmosphere, respectively. Note that the Ti film may not be oxidized and may be directly used as the middle layer 11.

The middle layer 11 has an advantage to increase orientation intensity of a first conductive film that will be subsequently formed, and a function to block Pb in a ferroelectric film of PZT group, which is formed on the first conductive film, from being diffused into a lower layer. Further, the middle layer 11 also has a function to improve adhesion between a first conductive film 12 that will be formed next and the interlayer insulating film 10.

Materials having self-orientation, which constitute the middle layer 11, are aluminum (Al), silicon (Si), copper (Cu), tantalum (Ta), tantalum nitride (TaN), iridium (Ir), iridium oxide ($IrO_x$), platinum (Pt) and the like other than Ti. The middle layer will be selected from these materials in the following embodiments as well.

Next, description will be made for the process until the structure shown in FIG. 3(a) will be formed.

Firstly, a Pt film as the first conductive film 12 is deposited at the thickness of 175 nm on the middle layer 11 by a sputtering method. In deposition conditions of the Pt film, 0.6 Pa is set as Ar gas pressure, 1 kW as DC power, and 100° C. as substrate temperature. Platinum is used as a target.

Note that a film of iridium, ruthenium, ruthenium oxide, ruthenium strontium oxide ($SrRuO_3$) or the like may be formed as the first conductive film 12. In this embodiment and the following embodiments, the first conductive film is made up of a material having self-orientation.

Next, the first conductive film 12 is subject thereon to formation of a PLZT (Lead Lanthanum Zirconate Titanate; $(Pb_{1-3x/2}La_x)(Zr_{1-y}Ti_y)O_3$)) film where lanthanum (La) has been added to PZT ($Pb(Zr_{1-x}Ti_x)O_3$) at the thickness of 100 to 300 nm, that is, 240 nm for example, by the sputtering method. The film is used as a ferroelectric film 13. Note that the PLZT film may be subject to an addition of calcium (Ca) and strontium (Sr).

Subsequently, the PLZT film is crystallized by RTA while the silicon substrate 1 is placed in oxygen atmosphere. In the crystallization conditions, 585° C. is set as substrate temperature, 20 seconds as processing time, 125° C./sec as temperature rising rate, and 2.5% and 97.5% as the respective ratios of $O_2$ and Ar introduced into oxidizing atmosphere.

As a forming method of the ferroelectric film 13, there are a spin-on method, a sol-gel method, an MOD (Metal Organic Deposition) method, and an MOCVD method other than the above-described sputtering method. Further, as the material of the ferroelectric film 13, there are PZT, $SrBi_2(Ta_xNb_{1-x})_2O_9$ (0 x≦1), $Bi_4Ti_2O_{12}$ and the like other than PLZT. Note that a high dielectric material such as (BaSr)$TiO_3$ (BST) and strontium titanate (STO) should be used instead of the above-described ferroelectric material when DRAM is formed.

Next, as shown in FIG. 3(b), a second conductive film 14 is formed on the ferroelectric film 13. The second conductive film 14 is formed by the following two steps.

Firstly, an iridium oxide ($IrO_x$) film as a lower conductive layer 14a of the second conductive film 14 is formed at the thickness of 20 to 75 nm, that is, 50 nm for example, on the ferroelectric film 13 by the sputtering method. After that, crystallization of the ferroelectric film 13 and annealing treatment to the lower conductive layer 14a are performed by RTA in oxygen atmosphere. In the RTA conditions, 725° C. is set as substrate temperature, 1 minute as processing time, and 1% and 99% as the respective ratios of $O_2$ and Ar introduced into oxidizing atmosphere.

Subsequently, the iridium oxide ($IrO_x$) film as an upper conductive layer 14b of the second conductive film 14 is formed at the thickness of 100 to 300 nm, that is, 200 nm for example, on the lower conductive layer 14a by the sputtering method.

Note that a platinum film or a ruthenium strontium oxide (SRO) film may be formed as the upper conductive layer 14b of the second conductive film 14 by the sputtering method.

Next, description will be made for the process until the structure shown in FIG. 4(a) will be formed.

Firstly, after a resist pattern (not shown) having same planar shape as that of an upper electrode has been formed on the second conductive film 14, the second conductive film 14 is etched by using the resist pattern as a mask, and a pattern of the second conductive film 14 that has been left serves as an upper electrode 14c of the capacitor.

Then, after the resist pattern has been removed, the ferroelectric film 13 is annealed in oxygen atmosphere under the conditions of 650° C. and 60 minutes. This annealing is performed to restore damage caused in the ferroelectric film 13 during the sputtering of the upper conductive layer 14b of the second conductive film 14 and during the etching of the second conductive film 14.

Subsequently, in the memory cell region A, the ferroelectric 13 is etched in the state where the resist pattern (not shown) is formed on the upper electrode 14c of the capacitor and its periphery, and the ferroelectric film 13 that has been left under the upper electrode 14c by the etching serves as a dielectric film 13a of the capacitor.

Then, the ferroelectric film 13 is annealed in nitrogen-oxygen atmosphere in the state where the resist pattern (not shown) has been removed. For example, the annealing is performed to degas moisture and the like absorbed in the ferroelectric film 13 and films thereunder.

Next, as shown in FIG. 4(b), an $Al_2O_3$ film as a first encap layer 15 is formed at the thickness of 50 nm on the upper electrode 14c, the dielectric film 13a and the first conductive film 12 under normal temperature by the sputtering method. The formation of the encap layer 15 is to protect the dielectric film 13a, which is easily reduced, from hydrogen and to block hydrogen from entering the inside of the film.

Note that a PZT film, a PLZT film, or titanium oxide may be deposited as the first encap layer 15. The $Al_2O_3$ film, the PZT film, the PLZT film, or the titanium oxide film as the encap layer may be deposited by MOCVD, or may be formed as a laminated film by two methods of sputtering and MOCVD. When the first encap layer 15 is the laminated film, a first formation of the $Al_2O_3$ film by sputtering is preferable taking deterioration of the capacitor in consideration.

After that, the first encap layer 15 is thermally treated under the conditions of 550° C. and 60 minutes in oxygen atmosphere to improve its film quality.

Next, resist (not shown) is coated on the first encap layer 15, and then it is exposed and developed to leave it in same planar shape as that of the lower electrode on the upper electrode 14c, the dielectric film 13a and their periphery. Then, the first encap layer 15, the first conductive film 12, and the middle layer 11 are etched by using the resist film as a mask, and the pattern of the first conductive film 12 that has been left by the etching serves as the lower electrode 11a of the capacitor. Note that the middle layer 11 also constitutes the lower electrode 11a. Etching of the first encap layer 15, the first conductive film 12, and the middle layer 11 is performed by dry etching using halogen element such as chlorine and bromine.

After the resist has been removed, the upper electrode 14c, the dielectric film 13a and the like are annealed under the conditions of 350° C. and 30 minutes in oxygen atmosphere. This is intended to prevent films that will be formed in post-process from being peeled.

Consequently, as shown in FIG. 5(a), capacitors Q made up of the lower electrode 11a (first conductive film 12/middle layer 11), the dielectric film 13a, and the upper electrode 14c (second conductive film) are formed on the first interlayer insulating film 10.

Next, description will be made for the process until the structure shown in FIG. 5(b) will be formed.

Firstly, an $Al_2O_3$ film is deposited as a second encap layer 15a at the thickness of 20 nm by the sputtering method to cover the capacitors Q and the interlayer insulating film 10. Another material employed for the first encap layer 15 may be used for the second encap layer 15a. Subsequently, the dielectric film 13a and the like are annealed under the conditions of 650° C. and 60 minutes in oxygen atmosphere to recover it from the damage.

Then, an $SiO_2$ film having the film thickness of 1500 nm as a second interlayer insulating film 16 is deposited on the encap layer 15a by the CVD method. As deposition gas regarding the growth of the second interlayer insulating film 16, silane ($SiH_4$), or polysilane compound (such as $Si_2F_6$, $Si_3F_8$, $Si_2F_3Cl$ or the like), and $SiF_4$ may be used, or TEOS may be used. The CVD method as a deposition method may be plasma excitation (ECR method: Electron Cyclotron Resonance, ICP method: Inductively Coupled Plasma, HDP: High Density Plasma, EMS: Electron Magneto-Sonic), thermal excitation, or an excitation method by laser beam. An example among deposition conditions of the second interlayer insulating film 16 using the plasma enhanced CVD method is shown below.

TEOS gas flow rate: 460 sccm
He (carrier gas of TEOS) flow rate: 480 sccm
$O_2$ flow rate: 700 sccm
Pressure: 9.0 Torr
Frequency of high-frequency power source: 13.56 MHz
Power of high-frequency power source: 400 W
Deposition temperature: 390° C.

Next, as shown in FIG. 6(a), a stress-controlling insulating film 30 made up of an $SiO_2$ film having the film thickness of 1500 nm is deposited on the rear surface of the silicon substrate 1 by the same deposition method and conditions as the deposition method and conditions of the second interlayer insulating film 16.

After that, as shown in FIG. 6(b), the top surface of the second interlayer insulating film 16 is planarized by the CMP method. The planarization of the surface of the second interlayer insulating film 16 is conducted until it has a thickness of 400 nm from the top surface of the upper electrode 14c. The second interlayer insulating film 16 is subject to adhesion to a surface thereof and absorption thereinside by moisture in slurry used in the planarization by the CMP method and moisture in cleaning liquid used during the subsequent cleaning.

Then, by heating the second interlayer insulating film 16 at the temperature of 390° C. in a vacuum chamber (not shown), the moisture on the surface of and inside the film is emitted outside. After such dehydration treatment, the second interlayer insulating film 16 is heated while it is exposed to $N_2O$ plasma, by which dehydration and improvement of film quality are performed. Thus, deterioration of the capacitors due to heating and moisture in the post-process is prevented. Such dehydration treatment and plasma treatment may be performed in a same chamber (not shown). A support electrode on which the silicon substrate 1 is mounted and an opposing electrode that opposes to the support electrode are arranged in the chamber and it is in a state such that high-frequency power source can be connected to the opposing electrode. Then, the high-frequency power source is applied to the opposing electrode in the state where $N_2O$ gas is introduced in the chamber so that $N_2O$ plasma is generated between the electrodes, and then $N_2O$ plasma treatment of the insulating film is performed. According to the $N_2O$ plasma treatment, nitrogen is contained at least in the surface of the insulating film. Such a method may be employed in some subsequent corresponding processes. It is preferable to use $N_2O$ plasma in the plasma treatment following the dehydration treatment, but NO plasma, $N_2$ plasma or the like maybe used, and the same meets the process that will be described later. Note that the substrate temperature in the dehydration treatment and the substrate temperature in the plasma treatment are substantially the same.

As shown in FIG. 7(a), the first interlayer insulating film 10, the second encap layer 15a, the second interlayer insulating film 16, and the cover film 9 are etched by a photolithography method using a resist pattern (not shown) to form contact holes 16a to 16c severally on the impurity diffusion layer 6a of the memory cell region A, contact holes 16d, 16e are simultaneously formed on the impurity diffusion layer 6b of the peripheral circuit region B, and a contact hole 16f is formed on the wiring 5d on the element isolation insulating film 2.

The second interlayer insulating film 16, the second encap layer 15a, the first interlayer insulating film 10, and the cover film 9 are etched by using a CF containing gas, that is, a gas mixture where $CF_4$ and Ar are added to $CHF_3$, for example.

Next, as shown in FIG. 7(b), RF (radio-frequency) etching is performed in order to conduct pre-treatment to a top surface of the second interlayer insulating film 16 and the inner surface of the contact holes 16a to 16f, and then a titanium (Ti) film of 20 nm and a titanium nitride (TiN) film of 50 nm are consecutively deposited on them by the sputtering method, and a glue layer 17 is formed by these films. Further, a tungsten (W) film 18 is formed on the glue layer 17 by the CVD method using a gas mixture of tungsten hexafluoride gas ($WF_6$), argon, and hydrogen. Note that silane ($SiH_4$) gas is also used in an initial growing period of the tungsten film 18. The tungsten film 18 should have a thickness such that each contact hole 16a to 16f is completely buried, which is about 500 nm on the uppermost surface of the glue layer 17, for example.

Subsequently, as shown in FIG. 8(a), the tungsten film 18 and the glue layer 17 on the top surface of the second interlayer insulating film 16 are removed by the CMP method, and they are left only in each contact hole 16a to 16f. Thus, the tungsten film 18 and the glue layer 17 in each of the contact holes 16a to 16f are used as conductive plugs 17a to 17f.

After that, the second interlayer insulating film 16 is heated again at the temperature of 390° C. in the vacuum chamber to discharge the moisture to the outside. This is to remove moisture, which has been attached to the surface of the second interlayer insulating film 16 and infiltrated inside the film in the processes of cleaning treatment after the formation of the contact holes 16a to 16f, cleaning treatment after the CMP, and the like. After such dehydration treatment, annealing is performed for two minutes, for example. In the annealing, the second interlayer insulating film 16 is heated while it is exposed to $N_2O$ plasma, and thus the film quality is improved.

Next, as shown in FIG. 8(b), an SiON film as an oxidation preventing film 19 for tungsten is deposited at the thickness of about 100 nm by the plasma enhanced CVD method on the second interlayer insulating film 16 and the conductive plugs 17a to 17f.

Next, as shown in FIG. 9(a), the second interlayer insulating film 16 and the encap layers 15, 15a on the upper electrodes 14c are etched by using the resist pattern (not shown) as a mask to form a hole 16g. At the same time, a hole is also formed on the lower electrode 11a extending out and making its appearance from the upper electrode 14c in the extending direction of the word line WL. Note that FIG. 9(a) does not show the hole on the lower electrode 11a, but it is shown by reference numeral 20g in FIG. 12.

The etching is performed by using CF containing gas, that is, a gas mixture where $CF_4$ and Ar are added to $CHF_3$ for example. After that, the resist pattern is removed.

Then, annealing at 550° C. for 60 minutes is performed in oxygen atmosphere in the state shown in FIG. 9(a), and thus the film quality of the dielectric film 13a is improved through the hole 16g. In this case, the conductive plugs 17a to 17f, which are made of tungsten that is easily oxidized, are not oxidized because they are covered by the oxidation preventing film 19.

Next, as shown in FIG. 9(b), the oxidation preventing film 19 on the second interlayer insulating film 16 and the conductive plugs 17a to 17f is etched by an etchback method to expose the conductive plugs 17a to 17f. In this case, the upper ends of the conductive plugs 17a to 17f are exposed upward from the second interlayer insulating film 16.

Subsequently, the surface of the conductive plugs 17a to 17f and the upper electrode 14c in the exposed state is etched by about 10 nm (converted on $SiO_2$) by an RF etching method, and thus a clean surface appears.

Then, a conductive film of a four-layer structure containing aluminum is formed on the second interlayer insulating film 16 and the conductive plugs 17a to 17f by the sputtering method. The conductive film is formed of a titanium nitride film having the film thickness of 150 nm, a copper-containing (0.5%) aluminum film having the thickness of 550 nm, a titanium film having the film thickness of 5 nm, and a titanium nitride film having the film thickness of 150 nm sequentially from the bottom.

Figure 10:
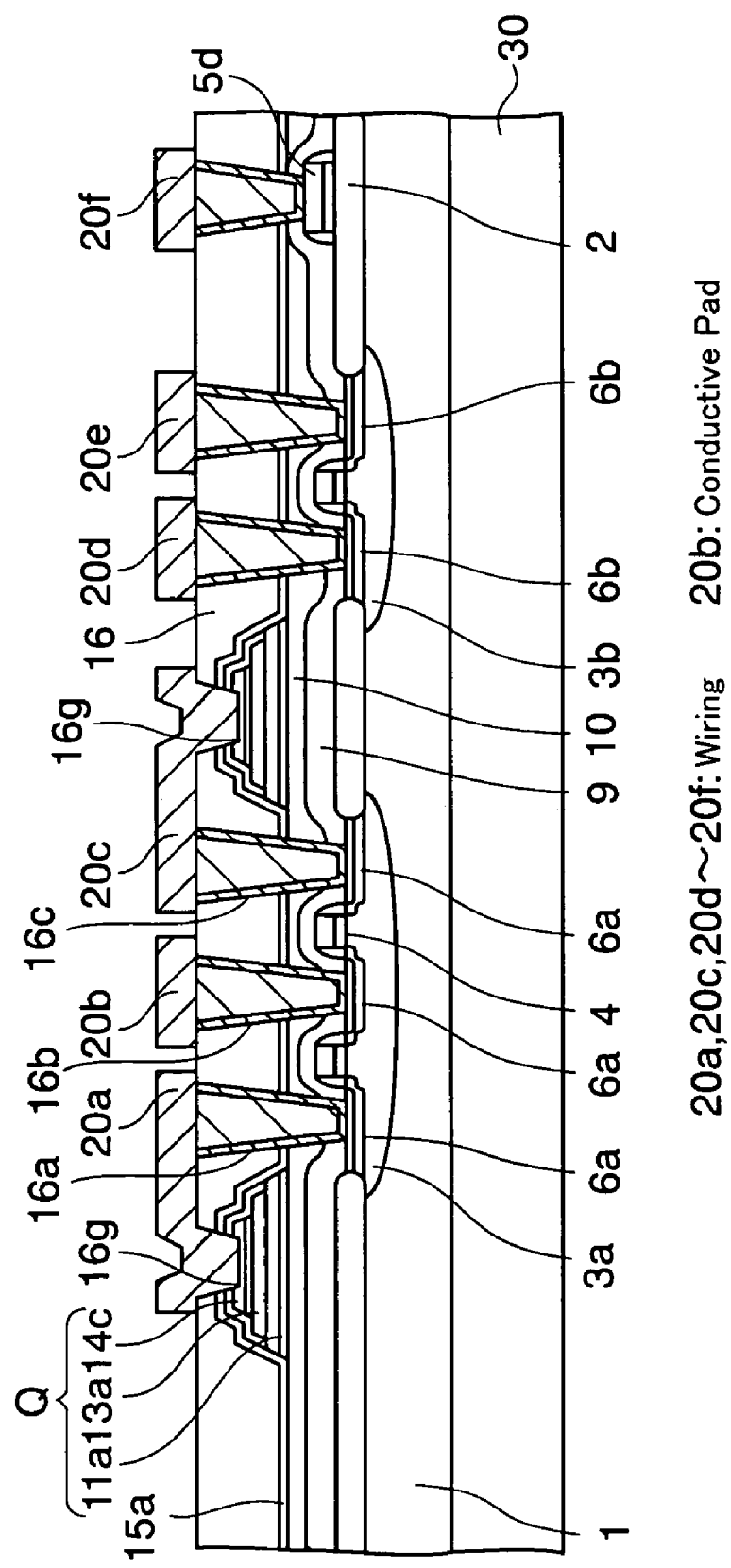
FIG. 10 is a sectional view (10) showing the manufacturing process of a semiconductor device according to the embodiment of the present invention.

Next, as shown in FIG. 10, the conductive film is patterned by the photolithography method to form first to fifth wirings 20a, 20c, 20d to 20f and a conductive pad 20b. Note that a wiring that connects with the lower electrode 11a is simultaneously formed in the hole 20a at this time.

In the memory cell region A, the first wiring 20a is connected with the upper electrode 14c, which is in one side of the p-well 3a, through the hole 16g, and connected with the conductive plug 17a on the p-well 3a, which is closest to the upper electrode 14c. The second wiring 20c is connected with the upper electrode 14c, which is in the other side of the p-well 3a, through the hole 16g, and connected with the conductive plug 17c on the p-well 3a, which is closest to the upper electrode 14a. The conductive pad 20b is formed as an island shape on the conductive pad 17b formed on the center of the p-well 3a. The third to fifth wirings 20d to 20f are connected with the conductive plugs 17d to 17f in the peripheral circuit region B.

Figure 12:
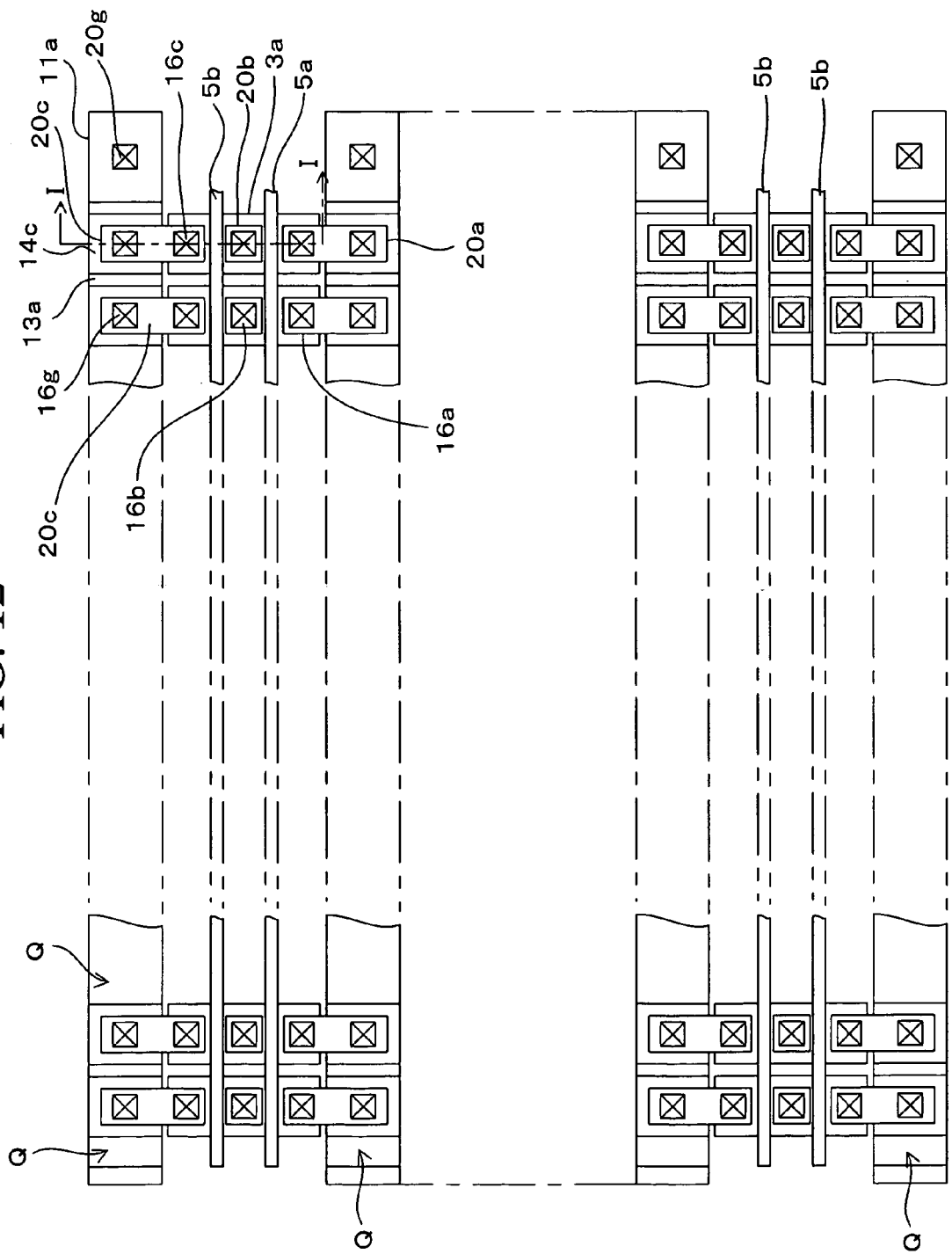
FIG. 12 is a plan view showing the arrangement relationship among capacitors and transistors, wirings and conductive pads, which are formed by the manufacturing method of the semiconductor device according to the present invention.

The two-dimensional arrangement relationship between the wirings 20a, 20c, the conductive pad 20b, the capacitors, and transistors is shown in FIG. 12. FIG. 10 corresponds to the sectional view taken along I—I line of FIG. 12. As shown in FIG. 12, the dielectric film 13a continuously extends as a beltlike shape on the lower electrode 11a continuously extending as a beltlike shape, and a plurality of the upper electrodes 14c are formed upon being spaced apart on one dielectric film 13a. Components shown by other reference numerals are the same as the ones shown by the same reference numerals in FIGS. 1 to 10.

Figure 11:
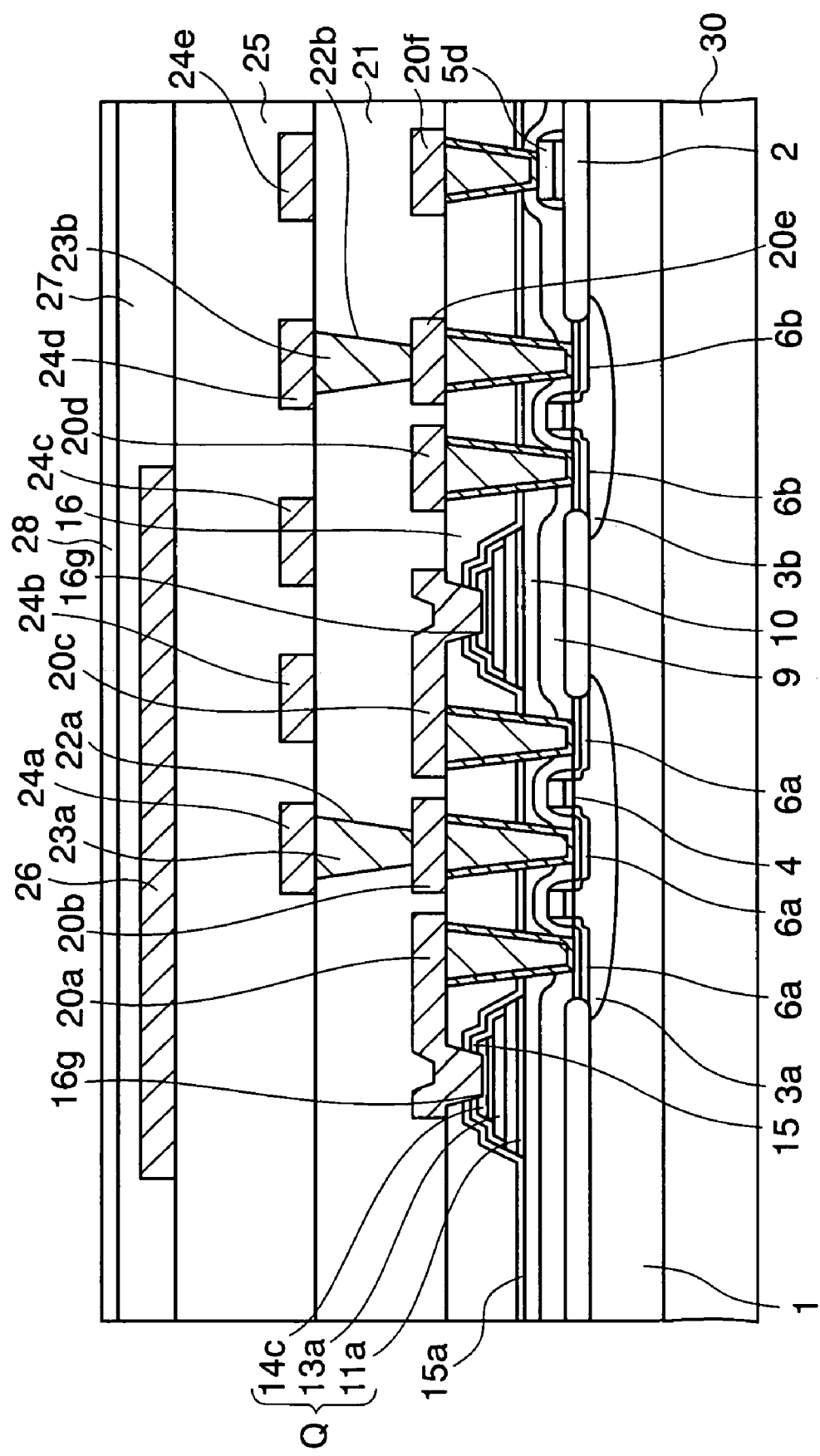
FIG. 11 is a sectional view (11) showing the manufacturing process of a semiconductor device according to the embodiment of the present invention.

Next, description will be made for the process until the structure shown in FIG. 11 will be formed.

Firstly, a third interlayer insulating film 21 is formed on the first to fifth wirings 20a, 20c, 20d to 20f and the conductive pad 20b, followed by planarizing the top surface of the third interlayer insulating film 21 by CMP.

Then, via holes 22a, 22b are formed on the third interlayer insulating film 21 by using a mask (not shown). The via holes 22a, 22b are formed on the conductive pad 20b, which is on the p-well of the memory cell region A, on the wiring 20e of the peripheral circuit region B, or on the other positions.

Furthermore, vias 23a, 23b made up of a TiN layer and a W layer are formed in the via holes 22a, 22b. The vias 23a, 23b are formed as follows. That is, the TiN layer and the W layer are formed in the via holes 22a, 22b and on the third interlayer insulating film by the sputtering method and the CVD method, and then the TiN layer and the W layer are removed from the top of the third interlayer insulating film by CMP, so that the vias 23a, 23b are left in the via holes 22a, 22b.

Subsequently, wirings 24a to 24e of a second layer are formed on the third interlayer insulating film 21, and then a fourth interlayer insulating film 25 is formed on the third interlayer insulating film 21 and the wirings 24a to 24e of the second layer. Further, the fourth interlayer insulating film 25 is planarized, and then a conductive pattern 26 made of aluminum is formed on the fourth interlayer insulating film 25. After that, a first cover insulating film 27 made of silicon oxide and a second cover insulating film 28 made of silicon nitride are sequentially formed on the fourth interlayer insulating film 25 and the conductive pattern 26.

Then, a protective film (not shown) is formed by resin or the like on the surface. Note that the rear surface of the substrate is ground by a back grinder treatment after the protective film has been formed when the thickness of the substrate needs to be adjusted. Consequently, the fundamental structure of the FeRAM is formed.

Note that the stress-controlling insulating film 30 may be left as it is to be processed into a chip, or may be removed by the back grinder treatment or the like in any process from after the process of forming the wiring 20a or the like and the conductive pad 20b of FIG. 10 to before the process of grinding the substrate rear surface by the back grinder treatment. It is due to the reason why, even in the case where the stress-controlling insulating film 30 has been removed, small stress can be maintained with respect to the substrate. That is, after annealing for improving the film quality of the dielectric film of the capacitors has ended, there is no process of thermal treatment performed at temperature of the annealing or higher, and there is no process where extremely large stress is applied after the process where the wiring 20a and the like have been formed.

The characteristics of the capacitors Q formed in the above-described embodiment are improved in contrast to conventional ones.

Meanwhile, description will be made in detail as follows for the result of survey on the characteristics of the capacitors Q formed in the above-described embodiment. Note that the interlayer insulating film and the stress-controlling insulating film described below are a silicon oxide film in principle. Another type of insulating film such as a silicon nitride film, a silicon oxynitride film, an alumina film, or the like may be used depending on cases.

Firstly, a FeRAM according to this embodiment is prepared as follows. In the FeRAM, the second interlayer insulating film 16 and then the stress-controlling insulating film 30 are formed in the order of a surface (S) a rear surface (R) by the aforementioned method. In addition, comparative samples are prepared as follows. That is, those are an FeRAM where an interlayer insulating film is formed only on a surface (S), an FeRAM where a thin interlayer insulating film, then a thick stress-controlling insulating film, and then a thick interlayer insulating film are formed in the order of a surface (S) a rear surface (R) the surface (S), and an FeRAM where a stress-controlling insulating film and then an interlayer insulating film are formed in the order of a rear surface (R) a surface (S).

The deposition method and the deposition conditions of a second interlayer insulating film and a stress-controlling insulating film in the comparative samples should be the same as the deposition method and the deposition conditions of the second interlayer insulating film 16 and the stress-controlling insulating film 30 in the above-described embodiment of the present invention. However, although the two layers of the thin interlayer insulating film and the thick interlayer insulating film are deposited on the surface in the sample of the surface (S) the rear surface (R) the surface (S), the film thickness of the two-layered interlayer insulating films was set equal to the thickness of one-layered interlayer insulating film of the other samples.

Figure 13:
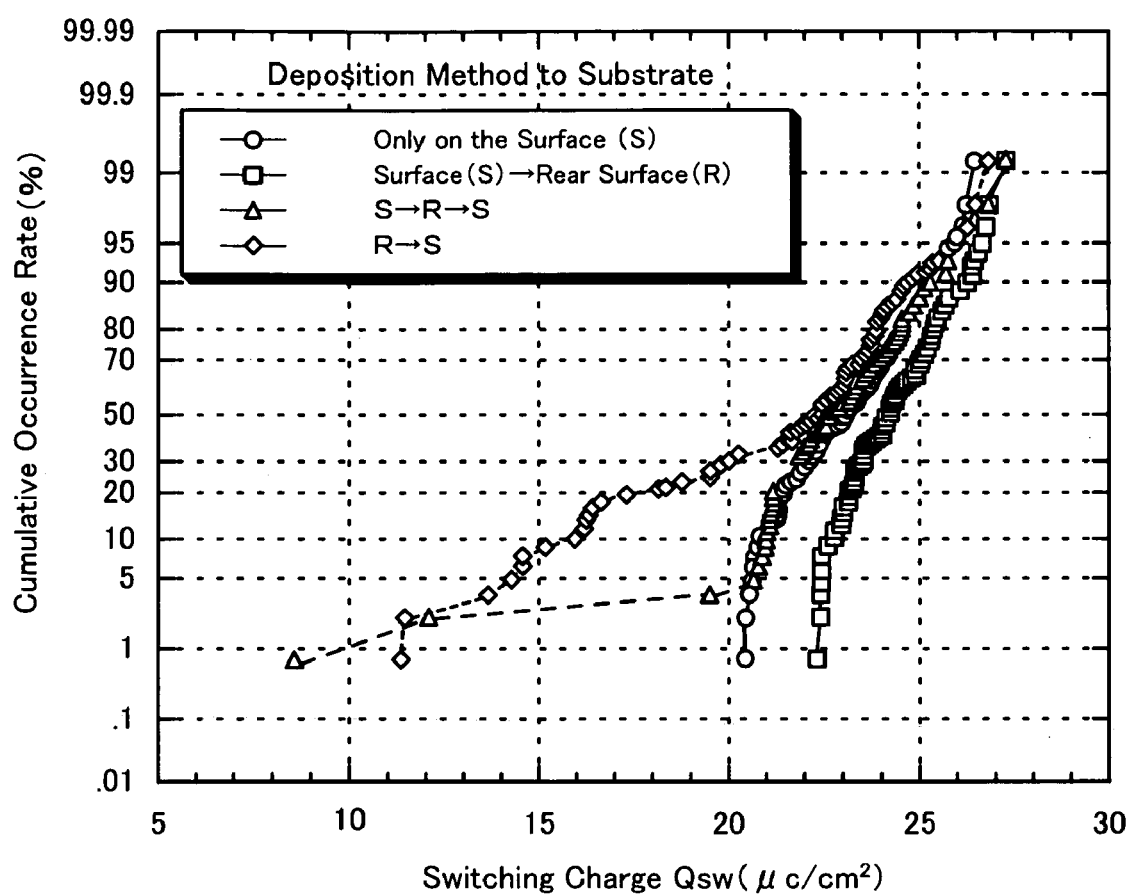
FIG. 13 is a graph showing switching charge distribution of capacitors of an FeRAM formed by the manufacturing method of the semiconductor device according to the present invention.

FIG. 13 is the graph showing the result of survey on the distribution of the switching charge ($Q_{sw}$) of the capacitors Q regarding each of the above-described FeRAMs. The axis of ordinate in FIG. 13 denotes cumulative occurrence rate (%) and the axis of abscissas denotes the switching charge ($Q_{sw}$) ($\mu C/cm^2$) indicated with linear scale.

In the drawing, circle marks show the characteristics of the FeRAM where the interlayer insulating film was formed only on the surface (S), square marks show the characteristics of the FeRAM of this embodiment where the second interlayer insulating film and then the stress-controlling insulating film were formed in the order of the surface (S) the rear surface (R) by the above-described process, triangle marks show the characteristics of the FeRAM where the interlayer insulating film, then the stress-controlling insulating film, and then the interlayer insulating film were formed in the order of the surface (S) the rear surface (R) the surface (S), and rhombus marks show the characteristics of the FeRAM where the stress-controlling insulating film and then the interlayer insulating film were formed in the order of the rear surface (R) the surface (S).

According to FIG. 13, in the case of the FeRAM (square marks) of this embodiment where deposition was performed in the order of the surface (S) the rear surface (R), the switching charge characteristic ($Q_{sw}$) is improved by 1 $\mu C/cm^2$ or more and variation is also improved from 13% to 9.97% comparing to the case of the FeRAM (circle marks) where deposition was performed only on the surface.

Further, in the case of the FeRAM (rhombus marks) where deposition was performed in the order of the rear surface (R) the surface (S), the distribution of the switching charge ($Q_{sw}$) is spread to lower values and the variation is worsened to 36%.

As described above, according to the manufacturing method of a semiconductor device of this embodiment, the stress-controlling insulating film 30 is deposited on the rear surface of the silicon substrate 1 after the second interlayer insulating film 16 coating the capacitors is formed, so that the stress of the second interlayer insulating film 16 can be loosened and uniform stress adjustment can be performed.

As a result, the characteristics of the capacitors represented by the switching charge can be maintained excellently and uniformly, or can be improved.

Moreover, since it is possible to reduce stress on the entire wafer, so-called edge deterioration that occurs remarkably on the FeRAM of the planar structure can be prevented. The edge deterioration is the phenomenon that stress concentrates on the side portion of the dielectric film 13a of the capacitors, which is at the edge portion of the lower electrode 11a common to the plurality of capacitors, and thus the capacitor characteristics are inclined to deteriorate. The phenomenon could occur when the insulating film that is formed by using TEOS as a material is formed on the capacitors.

Further, since a stress of the same type as that of the stress of the second insulating film 16 should be given to the stress-controlling insulating film 30, there is no need to adjust film stress so as to create opposite stress to each other depending on moisture content, and an insulating film of good quality having compressive stress, for example, with small moisture content can be used as both of the second interlayer insulating film 16 and the stress-controlling insulating film 30.

The present invention is explained in detail as described above, but the scope of the invention is not limited to the examples specifically shown in the above-described embodiments and modifications of the above-described embodiments without departing from the gist of the invention are incorporated in the scope of the invention.

For example, the above-described embodiments describe the FeRAM of the planar structure characterized in that the lower electrode 11a of the capacitors Q is connected with the transistor under the lower electrode 11a from the upper portion of the capacitors Q, but the invention can be applied for an FeRAM of a stack structure characterized in that connection is made from just under the lower electrode 11a of the capacitors directly to the transistor under the lower electrode 11a via the conductive plug.

Further, the deposition method and the deposition conditions of the second interlayer insulating film 16 and the stress-controlling insulating film 30 can be appropriately selected taking a laminated structure, a material used, and the like in consideration.

Furthermore, since the affect of the stress of the second interlayer insulating film 16 immediately on the capacitors is the largest in the above-described embodiments, the deposition method and the deposition conditions of the stress-controlling insulating film 30 are set equal to the deposition method and the deposition conditions of the second interlayer insulating film 16 so as to offset the stress with respect primarily to the second interlayer insulating film 16 immediately on the capacitors. However, because there is actually the affect of the stress of the wiring layer 20a or the like, the conductive pad 20b, and the third and fourth interlayer insulating films 21, 25, the deposition method and the deposition conditions of the stress-controlling insulating film 30 do not need to be set equal to the deposition method and the deposition conditions of the second interlayer insulating film 16, and can be appropriately selected so as to finally make the stress applied to the capacitors smaller.

Furthermore, the second interlayer insulating film 16 and the stress-controlling insulating film 30 are severally made up of a single layer of an SiO$_2$ film, but they can be severally made up of a single layer of a silicon nitride film, alumina film or the like instead of the SiO$_2$ film.

Still further, the second interlayer insulating film 16 and the stress-controlling insulating film 30 are severally made up of a single layer, but they can be severally made up of a multilayer structure of two layers or more that consist of insulating films of a same type or insulating films of different types.

Moreover, the second interlayer insulating film 16 and the stress-controlling insulating film 30 are formed by a chemical vapor deposition method under the condition of the deposition temperature at 390° C., but they can be formed by a chemical vapor deposition method with the deposition temperature condition that is 400° C. or lower and under which deposition can be performed.

According to the present invention described above, the stress-controlling insulating film is formed on the rear surface of the substrate after the second insulating film coating the capacitors is formed. Thus, the stress generated by the second insulating film is loosened and uniform stress adjustment is made possible. As a result, the characteristics of the capacitors can be maintained excellently and uniformly, or can be improved.

Moreover, since it is possible to reduce stress on the entire wafer, so-called edge deterioration that occurs remarkably on the FeRAM of the planar structure can be prevented.

What is claimed is:

1. A method of manufacturing a semiconductor device comprising the steps of:
    forming a transistor on a semiconductor substrate;
    forming a first insulating film above said transistor;
    forming a capacitor, which has a lower electrode, a dielectric film, and an upper electrode, on said first insulating film;
    forming a second insulating film coating said capacitor; and
    forming a stress-controlling insulating film on the rear surface of said semiconductor substrate after said second insulating film is formed.

2. The method of manufacturing a semiconductor device according to claim 1, wherein
    said second insulating film and said stress-controlling insulating film have same compressive stress as each other or same tensile stress as each other.

3. The method of manufacturing a semiconductor device according to claim 1, wherein
    said second insulating film and said stress-controlling insulating film severally have a multilayer structure of two layers or more.

4. The method of manufacturing a semiconductor device according to claim 1, wherein
    said second insulating film and said stress-controlling insulating film have a single layer structure of an insulating film containing silicon or a multilayer structure of insulating films containing silicon.

5. The method of manufacturing a semiconductor device according to claim 1, wherein
    said second insulating film and said stress-controlling insulating film are deposited by a chemical vapor deposition method.

6. The method of manufacturing a semiconductor device according to claim 5, wherein
    said second insulating film and said stress-controlling insulating film are formed at deposition temperature of 400° C. or lower.

7. The method of manufacturing a semiconductor device according to claim 5, wherein
    said second insulating film and said stress-controlling insulating film are deposited by said chemical vapor deposition method and deposition conditions same as each other.

8. The method of manufacturing a semiconductor device according to claim 1, wherein
a material of said dielectric film of said capacitor is ferroelectric.

9. The method of manufacturing a semiconductor device according to claim 1, wherein
a plurality of capacitors are formed on said lower electrode, and said lower electrode is common to said plurality of capacitors.

10. The method of manufacturing a semiconductor device according to claim 1, in which said lower electrode of said capacitor has a contact region that is not covered by said dielectric film and said upper electrode, and said method, after said second insulating film is formed, further comprises the steps of:
forming a first hole penetrating said first and second insulating films above said transistor;
forming a second hole penetrating said second insulating film above said contact region;
forming a third hole penetrating said second insulating film above said upper electrode of said capacitor;
forming a wiring, which connects said lower electrode with said transistor via said first and second holes, on said second insulating film; and
forming a wiring, which connects said upper electrode with said transistor via said third hole, on said second insulating film.

11. The method of manufacturing a semiconductor device according to claim 9, in which said lower electrode of said capacitors has a contact region that is not covered by said dielectric film and said upper electrodes, and said method, after said second insulating film is formed, further comprises the steps of:
forming a first hole penetrating said first and second insulating films above said transistor;
forming a second hole penetrating said second insulating film above said contact region;
forming a third hole penetrating said second insulating film above said upper electrode of said capacitor;
forming a wiring, which connects said lower electrode with said transistor via said first and second holes, on said second insulating film; and
forming a wiring, which connects said upper electrode with said transistor via said third hole, on said second insulating film.

12. The method of manufacturing a semiconductor device according to claim 10, said method further comprising the step of:
annealing said capacitor after the step of forming said capacitor.

13. The method of manufacturing a semiconductor device according to claim 12, wherein
the step of annealing said capacitor is performed in oxygen atmosphere through said third hole after the step of forming the third hole, which penetrates said second insulating film, above the upper electrode of said capacitor.

14. The method of manufacturing a semiconductor device according to claim 10, said method further comprising the step of:
removing said stress-controlling insulating film after the step of forming said wiring.

15. The method of manufacturing a semiconductor device according to claim 1, in which said lower electrode is connected with said transistor via said hole penetrating the first insulating film immediately under the lower electrode of said capacitor, and said method, after said second insulating film is formed, further comprises the steps of:
forming a fourth hole penetrating said second insulating film above said upper electrode of said capacitor; and
forming a wiring connecting with said upper electrode via said fourth hole on said second insulating film.

16. The method of manufacturing a semiconductor device according to claim 9, in which said lower electrode is connected with said transistor via said hole penetrating the first insulating film immediately under the lower electrode of said capacitors, and said method, after said second insulating film is formed, further comprises the steps of:
forming a fourth hole penetrating said second insulating film above said upper electrode of said capacitor; and
forming a wiring connecting with said upper electrode via said fourth hole on said second insulating film.

17. The method of manufacturing a semiconductor device according to claim 15, said method further comprising the step of:
annealing said capacitor after the step of forming said capacitor.

18. The method of manufacturing a semiconductor device according to claim 17, wherein
the step of annealing said capacitor is performed in oxygen atmosphere through said fourth hole after the step of forming the fourth hole, which penetrates said second insulating film, above the upper electrode of said capacitor.

19. The method of manufacturing a semiconductor device according to claim 15, said method further comprising the step of:
removing said stress-controlling insulating film after the step of forming said wiring.

* * * * *